United States Patent
Koizumi et al.

(12)

(10) Patent No.: US 6,466,503 B2
(45) Date of Patent: Oct. 15, 2002

(54) SEMICONDUCTOR MEMORY WITH CURRENT DISTRIBUTOR

(75) Inventors: Masayuki Koizumi, Yokohama; Hiroyuki Shibayama, Kawasaki, both of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/949,652

(22) Filed: Sep. 12, 2001

(65) Prior Publication Data

US 2002/0036929 A1 Mar. 28, 2002

(30) Foreign Application Priority Data

Sep. 26, 2000 (JP) ........................................ 2000-292562
Aug. 23, 2001 (JP) ........................................ 2001-253116

(51) Int. Cl.$^7$ ................................................. G11C 7/06
(52) U.S. Cl. ........................ 365/208; 365/207; 365/210
(58) Field of Search ................................ 365/205, 207, 365/208, 210, 185.21, 189.07

(56) References Cited

U.S. PATENT DOCUMENTS

| | | | | |
|---|---|---|---|---|
| 5,148,063 A | * | 9/1992 | Hotta | 365/185.21 |
| 5,963,484 A | * | 10/1999 | Jung | 365/210 |
| 6,028,791 A | * | 2/2000 | Tanaka | 365/185.21 |
| 6,069,831 A | * | 5/2000 | Jang et al. | 365/210 |

FOREIGN PATENT DOCUMENTS

JP    2001-14880    1/2001

\* cited by examiner

*Primary Examiner*—Son Mai
(74) *Attorney, Agent, or Firm*—Oblon, Spivak, McClelland, Maier & Neustadt, P.C.

(57) ABSTRACT

A semiconductor memory has paired first and second bit lines one of which passes a current representing data stored in a selected memory cell. If the first bit line transfers the current representing the data stored in the memory cell, the second bit line transfers a current representing data stored in a dummy cell. If the second bit line transfers the current representing the data stored in the memory cell, the first bit line transfers the current representing the data stored in the dummy cell. The current transferred through the first bit line is divided into partial currents, and the current transferred through the second bit line is also divided into partial currents. It is determined whether or not the current representing the data stored in the memory cell is passed through the first bit line. If it is determined that the first bit line passes the current representing the data stored in the memory cell, the partial currents from the first bit line are recombined to provide an output and one of the partial currents from the second bit line is selected to provide another output. If it is determined that the first bit line does not pass the current representing the data stored in the memory cell, i.e., the first bit line passes the current representing the data stored in the dummy cell, the partial currents from the second bit line are recombined to provide an output and one of the partial currents from the first bit line is selected to provide another output.

17 Claims, 6 Drawing Sheets

| STATE | I | II | III |
|---|---|---|---|
| READ LINE | BL0 | BL1 | OTHER PAIRED LINES |
| REFERENCE LINE | BL1 | BL0 | OTHER PAIRED LINES |
| RWL | L | H | L |
| WL | H | L | L |
| CURRENT TO SBL | $I_{N1}+I_{N2}$ | $I_{N3}+I_{N4}$ | 0 |
| CURRENT TO RBL | $I_{N3}$ | $I_{N2}$ | 0 |
| CURRENT TO N13 | $I_{N4}$ | $I_{N1}$ | 0 |

SEMICONDUCTOR MEMORY WITH CURRENT DISTRIBUTOR

CROSS REFERENCE TO RELATED APPLICATIONS

This application claims benefit of priority under 35 USC 119 based on Japanese Patent Applications P2000-292562 filed on Sep. 26, 2000, and P2001-253116 filed on Aug. 23, 2001, the entire contents of which are incorporated by reference herein.

BACKGROUND OF THE INVENTION

1. Field of the Invention

The present invention relates to a semiconductor memory including current-draw-type memory cells, and particularly, to a technique of reading data from a semiconductor memory.

2. Description of the Related Art

Japanese Patent Laid Open Publication (Kokai) No. 2001-14880 discloses a masked ROM. This ROM has a memory cell array including bit lines, word lines intersecting the bit lines, and memory cells formed at the intersections of the word and bit lines. The memory cells of this technique are MOS transistors that are programmed with the use of masks.

There is a semiconductor memory having dummy cells (RMCs) whose sizes are designed to provide a current draw ability that produces a potential level lower than a potential level corresponding to data "1" to be stored in a memory cell (MC) and higher than a potential level corresponding to data "0" to be stored in the memory cell. For example, the current draw ability of the dummy cells is designed to provide a potential level half the data "1" potential level. In this case, a reference bit line (RBL) used when reading data from a memory cell provides an intermediate potential level between the data "0" and "1" potential levels to be read through a selected bit line (BL).

This technique above mentioned has some problems. The current draw ability of each dummy cell in a semiconductor memory must carefully be designed to precisely achieve a potential level half the data "1" potential level. If the current draw ability is inaccurate, it deteriorates the operation speed of the semiconductor memory.

To halve a current passing through a dummy cell with respect to a current passing through an ON memory cell, this technique controls the dummy cell itself. This involves difficult in designing and manufacturing work since precisely design the size and impurity concentration of each dummy cell is required. Namely, it is difficult to include the dummy cells of such high precision in a memory cell array in which memory cells are formed, and therefore, the related art separately forms the dummy cells from the memory cells. The separate configuration prohibits sense amplifiers from switching dummy and memory cells from one to another. This means that the related art must additionally prepare related circuits including sense amplifiers for the dummy cells.

When a given dummy cell passes a current (½ of I) that is half a current (I) passing through an ON memory cell, an operating potential level in a bit line that accesses the dummy cell is increased the specified level and stabilized at the level to serve as a reference potential level. To attain the stabilized potential level, the bit line needs a time, which becomes a wait time or precharge time on a sense amplifier. The precharge time deteriorates the speed of a memory cell read operation. To sense an OFF memory cell, a wait time is prolonged to the precharge time plus a sense margin.

SUMMARY OF THE INVENTION

An aspect of the present invention provides a semiconductor memory including a memory cell array including memory cells, a dummy cell array including dummy cells, a first bit line configured to pass one of a current representing data stored in a memory cell selected from the memory cell array or a current representing data stored in a dummy cell selected from the dummy cell array, a second bit line configured to pass the current representing the data stored in the selected dummy cell if the first bit line passes the current representing the data stored in the selected memory cell or the current representing the data stored in the selected memory cell if the first bit line passes the current representing the data stored in the selected dummy cell, a switching circuit configured to receive the currents passing through the first and second bit lines and provide an output current substantially half the current representing the data stored in the selected dummy cell and an output current equal to the current representing the data stored in the selected memory cell, and a sense amplifier configured to receive the output current substantially half the current representing the data stored in the selected dummy cell and the output current equal to the current representing the data stored in the selected memory cell and amplify those output currents.

Another aspect of the present invention provides a method of sensing data stored in a memory cell in a memory cell array with paired first and second bit lines, including dividing a current passing through the first bit line into two partial currents dividing a current passing through the second bit line into two partial currents if the current passing through the first bit line represents the data stored in the memory cell and if the current passing through the second bit line represents data stored in a dummy cell in a dummy cell array, providing a first output formed by recombining the partial currents from the first bit line, providing a second output formed by selecting one of the partial currents from the second bit line, and amplifying the first and second outputs, and if the current passing through the first bit line represents the data stored in the dummy cell and if the current passing through the second bit line represents the data stored in the memory cell, providing a third output formed by selecting one of the partial currents from the first bit line, providing a fourth output formed by recombining the partial currents from the second bit line, and amplifying the third and fourth outputs.

DETAILED DESCRIPTION OF EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following description, a word "connect" defines a state in which first and second elements are electrically connected to each other without regard to whether or not there is a physical connection between the elements. Even if one or a plurality of third elements are present between the first and second elements, it will be described that the first and second elements are connected to each other, as long as the first and second elements have electrical communication between them. The same is applied to a word "couple."

(Sensing data stored in memory cell)

Figure 1:
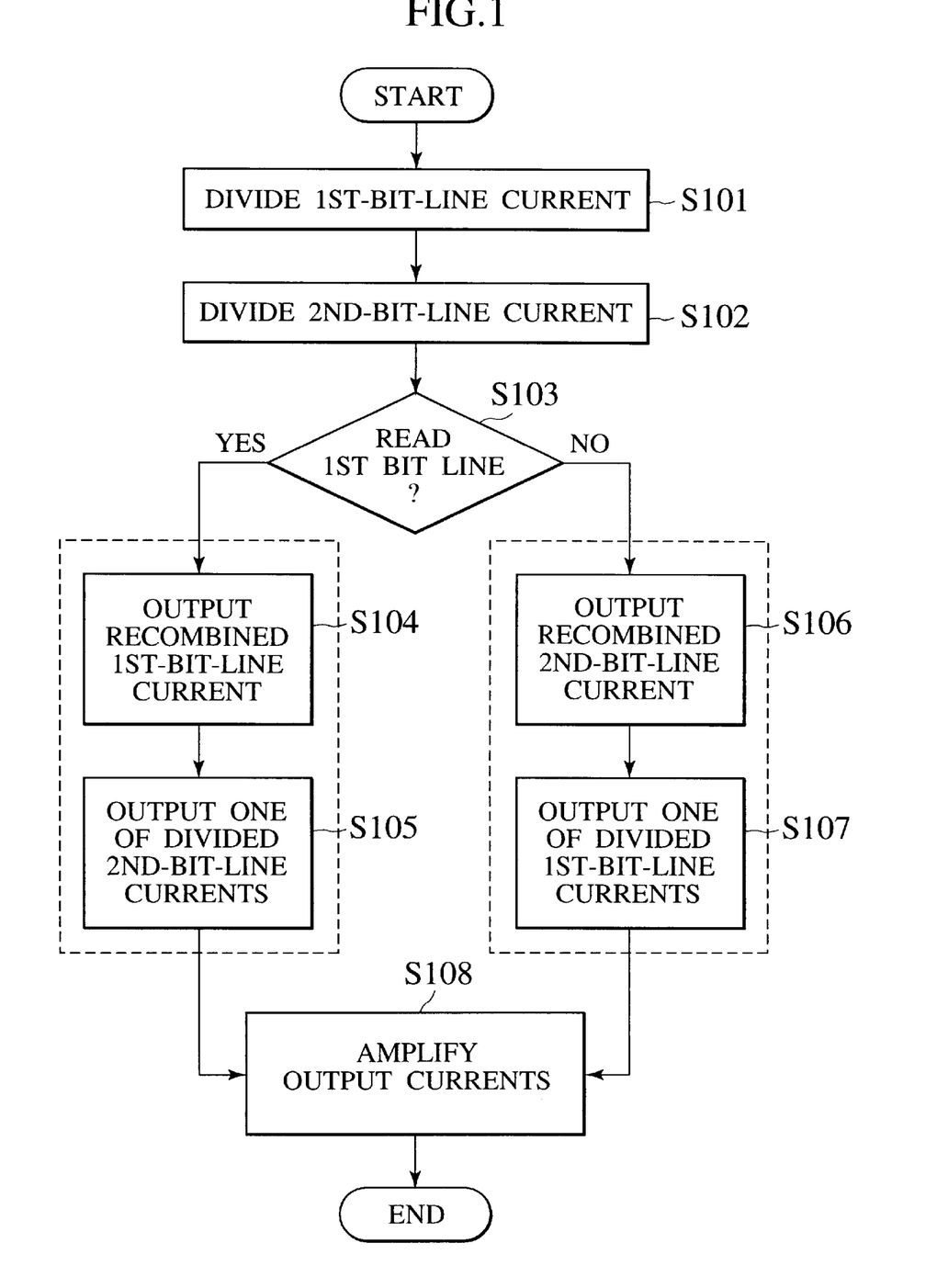
FIG. 1 is a flowchart showing a technique of sensing data stored in a memory cell in a semiconductor memory according to an embodiment of the present invention.
Figure 2:
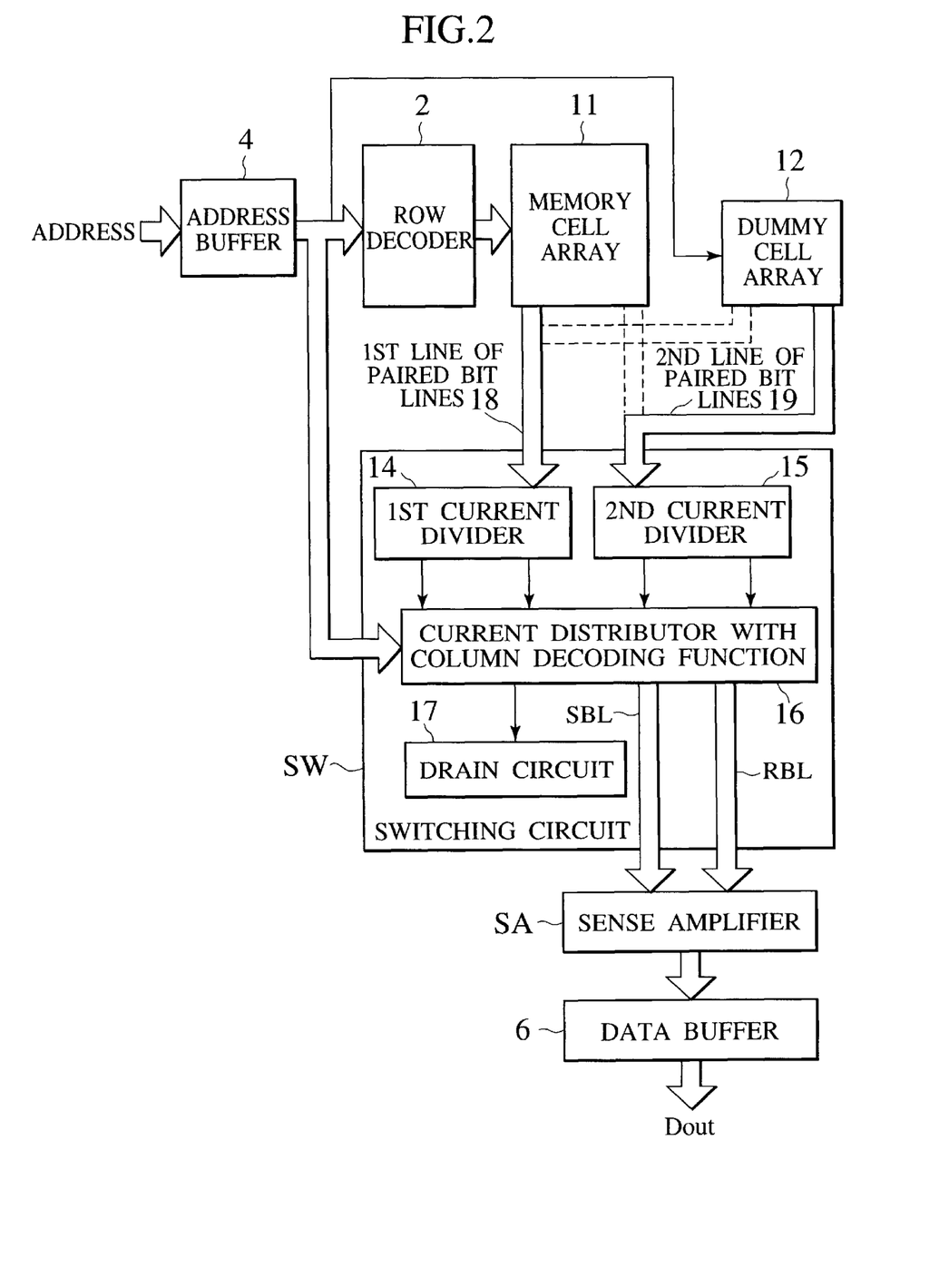
FIG. 2 is a block diagram showing a semiconductor memory according to an embodiment of the present invention.

FIG. 1 is a flowchart showing a data sensing technique according to an embodiment of the present invention, and FIG. 2 is a block diagram showing a semiconductor memory according to an embodiment of the present invention to achieve the technique of FIG. 1. The semiconductor memory has memory cells and dummy cells. Each memory cell transfers data through paired bit lines consisting of first and second bit lines. If the first bit line transfers data from a memory cell, the second bit line transfers data from a dummy cell. If the first bit line transfers data from a dummy cell, the second bit line transfers data from a memory cell.

When a memory cell is selected to read data, a current representing the data stored in the selected memory cell passes through one of the first and second bit lines of paired bit lines corresponding to the selected memory cell. In this explanation, a current passed through a bit line in response to data stored in a cell is a current generated based on the data, or a current drawn based on the data. If the first bit line passes a current (referred to as the memory cell current) representing data in a selected memory cell, the second bit line passes a current (referred to as the dummy cell current) representing data in a dummy cell selected in connection with the selected memory cell. If the second bit line passes the memory cell current, the first bit line passes the dummy cell current. Step S101 of FIG. 1 divides the current passing through the first bit line into partial currents, and step S102 divides the current passing through the second bit line into partial currents.

Step S103 determines whether or not the first bit line is a read bit line to pass the memory cell current. This determination is made by using, for example, an input address signal. The step S103 is not limited to this. The step S103 according to this embodiment may determine whether or not the second bit line is a read bit line to pass the memory cell current. In both cases, if the first bit line passes the memory cell current, i.e., the second bit line passes the dummy cell current, then the process advances to step S104. On the other hand, if the first bit line passes the dummy cell current, i.e., the second bit line passes the memory cell current, then the process advances to step S106.

If step S103 determines that the first bit line passes the memory cell current, step S104 recombines the partial currents from the first bit line into one and outputs the recombined current. Then, step S105 outputs one of the partial currents from the second bit line. If step S103 determines that the first bit line does not pass the memory cell current, i.e., the first bit line passes the dummy cell current, step S106 recombines the partial currents from the second bit line into one and outputs the recombined current. Then, step S107 outputs one of the partial currents from the first bit line. After step S105 or S107, step S108 amplify the output currents provided by steps S104 and S105, or steps S106 and S107.

Instead of carrying out step S104 and then step S105, step S105 may be carried out before or in parallel with step S104. Instead of carrying out step S106 and then step S107, step S107 may be carried out before or in parallel with step S106.

In this way, the embodiment passes the same current through the first and second lines of paired bit lines if the selected memory cell is ON. Due to this, the memory and dummy cells according to the embodiment can have an identical circuitry. The embodiment is capable of correctly controlling a cell current, improving a sense margin with respect to an OFF cell to increase an operation speed, and shortening a current passing time to reduce power consumption.

(Semiconductor memory)

The semiconductor memory of FIG. 2 according to an embodiment of the present invention will be explained. The semiconductor memory includes an address buffer 4, a row decoder 2, a memory cell array 11, a dummy cell array 12, a switching circuit SW, a sense amplifier SA, and a data buffer 6.

The address buffer 4 receives an address signal from the outside of the semiconductor memory and temporarily holds the address signal. Part or whole of the address signal in the address buffer 4 is provided at proper timing to the row decoder 2 and switching circuit SW. In this embodiment, the address signal to the row decoder 2 is used to select a word line. The address signal to the switching circuit SW is used to select a bit line. The address signal is also supplied to the dummy cell array 12, to specify a dummy word line to select a proper dummy cell corresponding to a selected memory cell.

The row decoder 2 receives, from the address buffer 4, an address signal according to which the row decoder 2 provides a word line select signal to specify a word line connected to a target memory cell in the memory cell array 11.

The target memory cell selected in the memory cell array 11 by the word line select signal provides data by passing a current through a bit line connected to the memory cell.

The dummy cell array 12 partly or wholly receives the address signal provided by the address buffer 4 to the row decoder 2. According to the received address signal, a dummy cell in the dummy cell array 12 is selected. If the selected memory cell is connected to a first bit line 18 of paired bit lines, the dummy cell selected from the dummy cell array 12 is connected to a second bit line 19 of the paired bit lines. If the selected memory cell is connected to the second bit line 19, the dummy cell is connected to the first bit line 18.

The switching circuit SW receives currents passing through the first and second bit lines 18 and 19 and provides a plurality of output currents. According to the embodiment, the switching circuit SW includes a first current divider 14, a second current divider 15, a current distributor 16 with a column decoder function, and a drain circuit 17.

The first current divider 14 divides a current I passing through the first bit line 18 into partial currents, which are preferably equal to each other.

The second current divider 15 divides a current I passing through the second bit line 19 into partial currents, which are preferably equal to each other.

Based on the selected memory cell, the current distributor 16 supplies the partial currents to a signal bit line SBL, a reference bit line RBL, and the drain circuit 17. The column decoder function of the current distributor 16 selects a bit line according to the address signal from the address buffer 4 and transfers the current I passing through the selected bit line to the signal bit line SBL.

Figure 3:
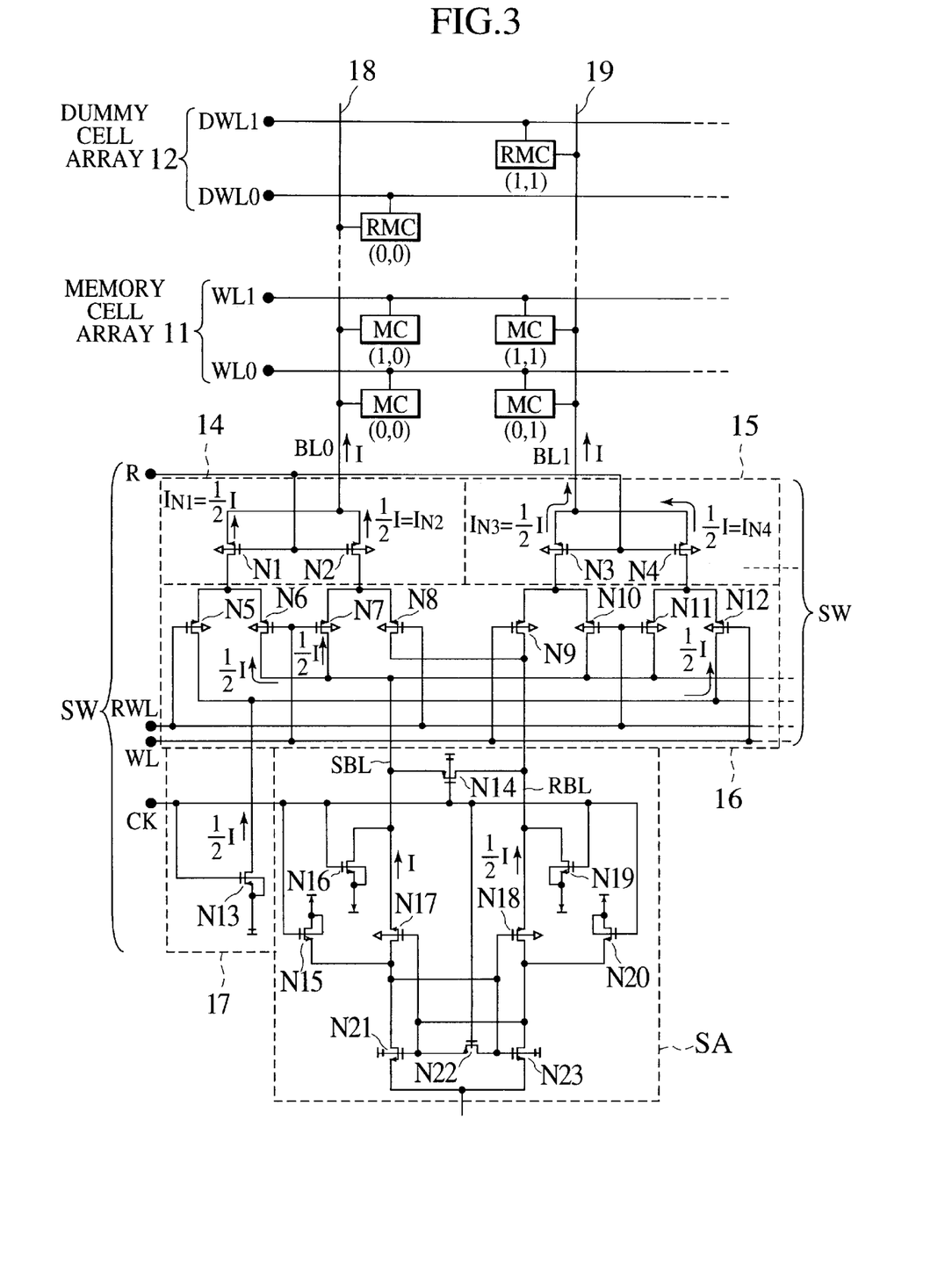
FIG. 3 is a circuit diagram showing a part of the semiconductor memory of FIG. 2.

If the selected bit line is a bit line BL0 (which is shown in FIG. 3 and may correspond to the first bit line 18), the current distributor 16 transfers the current I passing through the bit line BL0 to the signal bit line SBL. And the current distributor 16 transfers half the current I passing through a bit line BL1 (which is shown in FIG. 3 and may correspond to the second bit line 19) paired with the bit line BL0 to the reference bit line RBL. Further, the current distributor 16 transfers the remaining half of the current I passing through the bit line BL1 to the drain circuit 17. If the selected bit line is the bit line BL1, the current distributor 16 transfers the current I passing through the bit line BL1 to the signal bit line SBL, half the current I passing through the bit line BL0 to the reference bit line RBL, and the remaining half of the current I passing through the bit line BL0 to the drain circuit 17.

The drain circuit 17 passes the transferred current in synchronization with the currents passing through the lines SBL and RBL. Namely, the drain circuit 17 is a switch to pass a current in synchronization with currents passing through the lines SBL and RBL.

The sense amplifier SA detects and amplifies data passed through the bit line selected by the switching circuit SW, thereby reading the data.

The data buffer 6 transfers the read data to a data terminal Dout.

FIG. 3 is a circuit diagram showing part of the semiconductor memory of FIG. 2. Although the memory cell array 11 and dummy cell array 12 in FIG. 3 involve the common bit lines 18 and 19, this configuration does not limit the present invention. Although the semiconductor memory of the embodiment is a masked ROM, this does not limit the present invention. Although the cells in the arrays 11 and 12 according to the embodiment are current-draw-type cells, this does not limit the present invention.

According to the embodiment, the memory cell array 11 includes the bit lines BL0 and BL1, word lines WL0 and WL1 intersecting the bit lines, and memory cells (MCs) (0, 0), (1, 0), (0, 1), and (1, 1) formed at the intersections. Any one of the memory cells is selectable by specifying a word line and a bit line that intersect at the memory cell. According to the embodiment, the bit lines BL0 and BL1 are paired. If the bit line BL0 is a first bit line 18, the bit line BL1 is a second bit line 19. When one of the bit lines is selected to read data from a selected memory cell, the other bit line functions to pass a reference current. Namely, if a memory cell connected to one of the paired bit lines is selected, a dummy cell connected to the other of the paired bit lines is selected.

For the sake of simplicity of explanation, the numbers of word and bit lines in the embodiment are limited. This does not limit the present invention.

The dummy cell array 12 involves the bit lines BL0 and BL1 shared with the memory cell array 11, and word lines DWL0 and DWL1 dedicated to the dummy cell array 12. Current-pull-type dummy cells (RMCs) (0, 0) and (1, 1) are formed at the intersections of the bit lines BL0 and BL1 and the dummy word lines DWL0 and DWL1.

For example, the word line WL0 and bit line BL0 are selected to select the memory cell (0, 0). When the bit line BL0 is selected, the bit line BL1 pared with the bit line BL0 is also selected to serve as a reference bit line. As a result, the dummy word line DWL1 is selected to turn on the dummy cell (1, 1).

The current draw ability of each memory cell may be in inverse proportion to the electric resistance of a dummy cell that is ready to pass a current. Instead, the current draw ability of each of the memory cells (0, 0) and (1, 0) may be equal to the current draw ability of the dummy cell (0, 0), and the current draw ability of each of the memory cells (0, 1) and (1, 1) may be equal to the current draw ability of the dummy cell (1, 1).

Figure 4A:
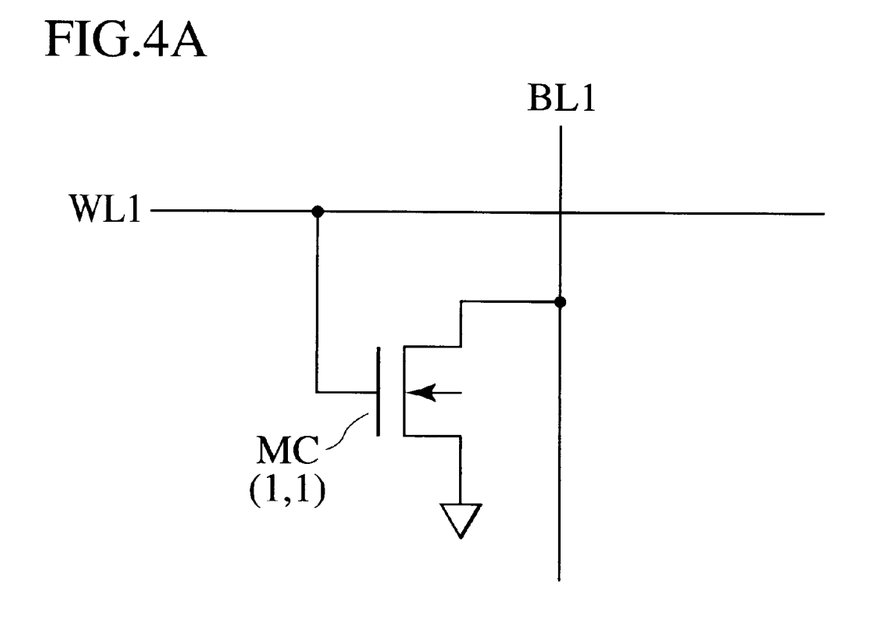
FIGS. 4A ad 4B are circuit diagrams showing a memory cell and a dummy cell contained in the part shown in FIG. 3.

FIG. 4A shows an NMOS transistor serving as the memory cell (1, 1) according to the embodiment. The NMOS transistor is programmed with the use of a mask. The NMOS transistor has a gate electrode connected to the word line WL1 and a source electrode connected to the bit line BLI. The other memory cells of the embodiment may have the same structure. Each memory cell permanently stores binary data, i.e., data "0" or "1." The data "0" is stored under, for example, a high threshold voltage state such as an E-type state, and the data "1" is stored under, for example, a low threshold voltage state such as a D-type state. In an unselected state of the memory cell, the word line WL1 is set to a potential level lower than the low threshold voltage, and in a selected state of the memory cell, to an intermediate potential level between the low and high threshold voltages. As a result, the current draw ability of each memory cell differs depending on data stored in the memory cell. Namely, the current draw ability of each memory cell differs between ON (data "1") and OFF (data "0") states of the NMOS transistor that forms the memory cell. Data of 1 or 0 may be written into a memory cell by forming, or not forming a via plug for the memory cell with the use of a mask. In this case, the presence of the via plug, i.e., wire connection/disconnection determines data of 0 or 1 stored in the memory cell.

Figure 4B:
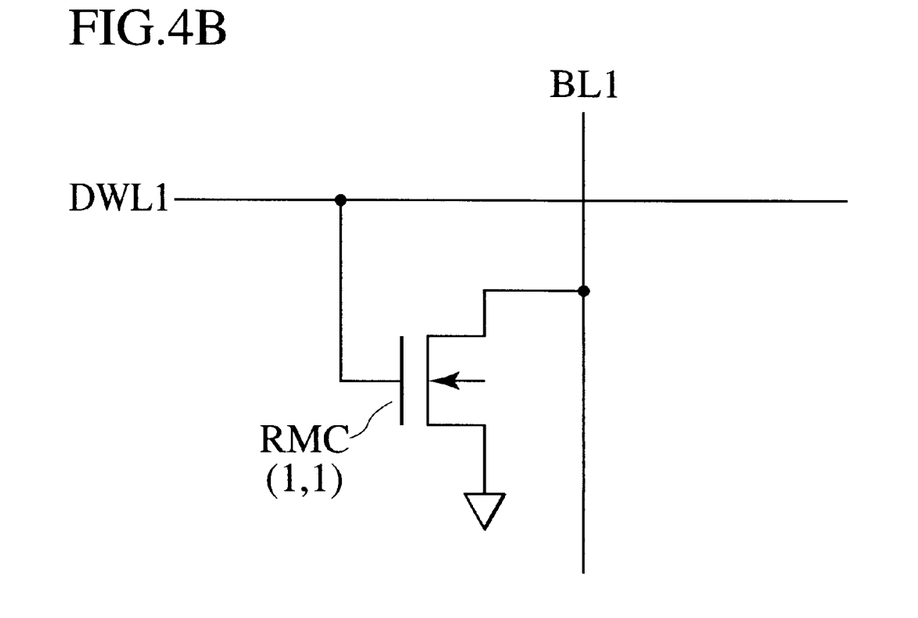

FIG. 4B shows a MOS transistor serving as the dummy cell (1, 1) according to the embodiment. The MOS transistor has a gate electrode connected to the dummy word line DWL1 and a source electrode connected to the bit line BL1. All dummy cells according to the embodiment may have the same structure. The dummy cells (0, 0) and (1, 1) have each the same current draw ability as that of a memory cell of high (ON) state. According to the embodiment, the dummy cells and the memory cells may have an identical structure.

The dummy cell array 12 may be incorporated in the memory cell array 11. For example, the dummy cell (0, 0) may be formed between the memory cells (0, 0) and (1, 0), and the dummy cell (1, 1) may also be formed between the memory cell (0, 1) and the switching circuit SW. A plurality of dummy cells may be connected to the bit line BL1. In this case, a dummy cell that is closest to a selected memory cell serves as a reference cell. This arrangement improves an accuracy of comparison between currents passing through selected memory and dummy cells. Incorporating dummy cells in a memory cell array minimizes current differences between the memory cells and the dummy cells due to source voltage variations or process variations. This allows the semiconductor memory to operate at a smaller sense margin.

The switching circuit SW has the first current divider 14 to halve a current I passing through the bit line BL0 into partial currents $I_{N1}$ and $I_{N2}$, and the second current divider 15 to halve a current I passing through the bit line BL1 into partial currents IN3 and $I_{N4}$. The first current divider 14 according to this embodiment has NMOS transistors N1 and N2 having the same driving capacity and the same structure. The transistors N1 and N2 have gate electrodes connected to a reference voltage line R. According to a voltage in the reference voltage line R, the transistors N1 and N2 control currents. The voltage in the reference voltage line R may be changed to control the pass timing of currents, or the sizes of currents. The transistors N1 and N2 have source electrodes connected to the bit line BL0 of the paired bit lines 18 and 19. The drain electrode of the transistor N1 is connected to the source electrodes of NMOS transistors N5 and N6 of the current distributor 16. The drain electrode of the transistor N2 is connected to the source electrodes of NMOS transistors N7 and N8 of the current distributor 16. The second current divider 15 has NMOS transistors N3 and N4 having the same driving capacity and structure as those of the transistor N1. The transistors N3 and N4 have gate electrodes connected to the reference voltage line R, and source electrodes connected to the bit line BL1 paired with the bit line BL0. The drain electrode of the transistor N3 is connected to the source electrodes of NMOS transistors N9 and N10 of the current distributor 16. The drain electrode of the transistor N4 is connected to the source electrodes of NMOS transistors N11 and N12 of the current distributor 16. With this configuration, the drain current $I_{N1}$ of the transistor N1 is equalized with the drain current $I_{N2}$ of the transistor N2. Similarly, the drain current $I_{N3}$ of the transistor N3 is equalized with the drain current $I_{N4}$ of the transistor N4. Depending on data in a selected memory cell, the currents $I_{N1}$, $I_{N2}$, $I_{N3}$, and $I_{N4}$ will each be equal to half the current I.

The drain circuit 17 formed in the switching circuit SW passes the current INI of the current divider 14 or the current $I_{N4}$ of the current divider 15 in synchronization with the current $I_{N3}$ or $I_{N2}$ passing through the reference bit line RBL. The drain circuit 17 has a PMOS transistor N13. The gate electrode of the transistor N13 is connected to a clock signal line CK, which is connected to the sense amplifier SA. The drain electrode of the transistor N13 is connected to the drain electrodes of the transistors N5 and N12 of the current distributor 16. The source electrode of the transistor N13 is connected to a power source.

The current distributor 16 has the NMOS transistors N5 to N12. The gate electrodes of the transistors N5, N8, N10, and N11 are connected to a reference word line RWL. The gate electrodes of the transistors N6, N7, N9, and N12 are connected to a word line WL. The source electrodes of the transistors N5 and N6 are connected to the drain electrode of the transistor N1 of the current divider 14. The source electrodes of the transistors N7 and N8 are connected to the drain electrode of the transistor N2 of the current divider 14. The source electrodes of the transistors N9 and N10 are connected to the drain electrode of the transistor N3 of the current divider 15. The source electrodes of the transistors N11 and N12 are connected to the drain electrode of the transistor N4 of the current divider 15. The drain electrodes of the transistors N5 and N12 are connected to the drain electrode of the transistor N13 of the drain circuit 17. The drain electrodes of the transistors N6, N7, N10, and N11 are connected to the signal bit line SBL, which is connected to the sense amplifier SA. The drain electrodes of the transistors N8 and N9 are connected to the reference bit line RBL, which is connected to the sense amplifier SA.

The sense amplifier SA compares the current passing through the signal bit line SBL with the current passing through the reference bit line RBL. The lines SBL and RBL are connected to the sense amplifier SA, which amplifies the currents passing through the lines SBL and RBL and provides a complementary output signal. The sense amplifier SA has PMOS transistors N14, N15, N16, N19, N20, N21, N22, and N23 and NMOS transistors N17 and N18. The gate electrodes of the transistors N14, N15, N16, N19, N20, and N22 are connected to the clock signal line CK. The source electrodes of the transistors N14 and N17 and the drain electrode of the transistor N16 are connected to the signal bit line SBL. The drain electrodes of the transistors N14 and N19 and the source electrode of the transistor N18 are connected to the reference bit line RBL. The drain electrode of the transistor N17 is connected to the source electrode of the transistor N15, the drain electrodes of the transistors N21 and N22, and the gate electrodes of the transistors N18 and N23. The drain electrode of the transistor N23 is connected to the gate electrodes of the transistors N17 and N21. The source electrode of the transistor N21 is connected to the source electrode of the transistor N23 and the outside such as the data buffer 6. The drain electrodes of the transistors N15 and N20 and the source electrodes of the transistors N16 and N19 are connected to the power source.

A data read operation of the semiconductor memory according to the embodiment will be explained. The two bit lines BL0 and BL1 are paired. When one of the paired bit lines is electrically coupled with the signal bit line SBL, the other is coupled with the reference bit line RBL. A read operation according to the embodiment will be explained in three cases shown in FIG. 5. The case (I) selects the bit line BL0 as a read line and connects the bit line BL0 to the signal bit line SBL. In this case, the bit line BL0 is used to read data from, for example, the memory cell (0, 0). The case (II) selects the bit line BL1 as a read line and connects the bit line BL1 to the signal bit line SBL In this case, the bit line BL1 is used to read data from, for example, the memory cell (1, 1). The case (III) selects a bit line other than the bit lines BL0 and BL1, to read data from a memory cell connected to the selected bit line.

The reference voltage line R is set to a proper potential level before the read operation. The potential level of the reference voltage line R may be changed to change the gate voltage of the transistors N1 to N4, to thereby change the amplitudes of the currents $I_{N1}$, $I_{N2}$, $I_{N3}$, and $I_{N4}$. This results in changing the amplitude of the current I passing through the bit line BL0, etc.

(I) Reading data from memory cell (0, 0)

To select the memory cell (0, 0), the word line WL0 and bit line BL0 are selected. As a result, the bit line BL1 paired with the bit line BL0 is selected to serve as a reference bit line, and the dummy cell (1, 1) connected to the bit line BL1 is selected to serve as a reference cell.

Figure 5:
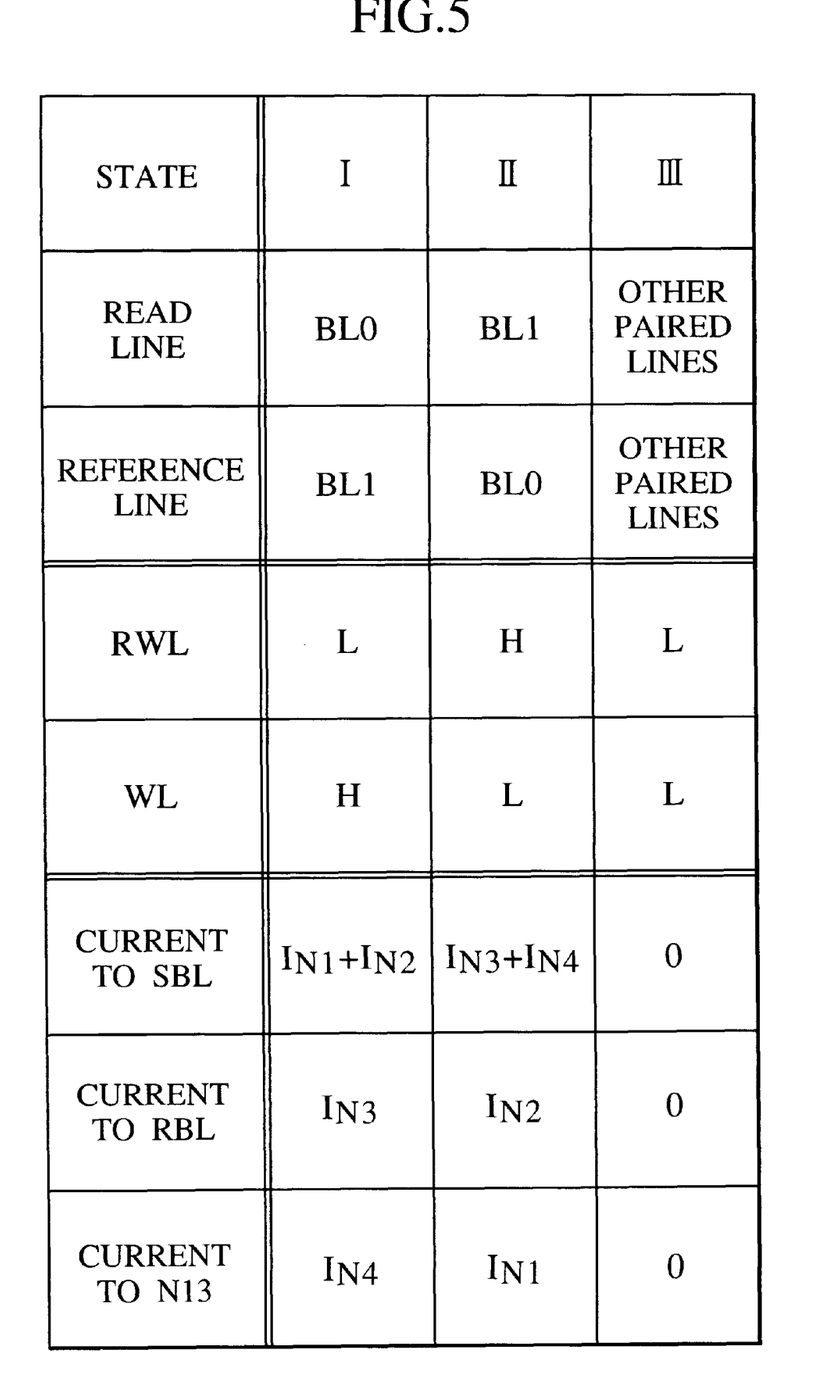
FIG. 5 is a list explaining various operating states of the semiconductor memory of FIG. 2.

Address data is supplied to the row decoder 2 to select the word line WL0. The address data is also supplied to the current distributor 16, whose column decoder sets the reference word line RWL to low and the word line WL to high as shown in FIG. 5.

As a result, the switching transistors N5, N8, N10, and N11 are turned off, and the switching transistors N6, N7, N9, and N12 are turned on.

A current I passing through the signal bit line SBL is made of the current $I_N$ flowing to the bit line BL0 through the transistors N6 and N1 and the current $I_{N2}$ flowing to the bit line BL0 through the transistors N7 and N2.

A current "½ of I" passing through the reference bit line RBL is the current $I_{N3}$ flowing to the bit line BL1 through the transistors N9 and N3.

A current "½ of I" passing through the switching transistor N13 of the drain circuit 17 is the current $I_{N4}$ flowing to the bit line BL1 through the transistors N12 and N4.

As a result, the bit line BL0 is selected as a data read line, and the bit line BL1 as a reference line. Namely, the dummy cell (1, 1) becomes ON due to the selection of the dummy word line DWL1, the bit line BL1 passes the current I, and the reference bit line RBL passes half the current I. If the memory cell (0, 0) is ON, the current I flows from the signal bit line SBL to the bit line BL0, and if the memory cell (0, 0) is OFF, the lines SBL and BL0 pass no current.

The sense amplifier SA determines whether or not the current passing through the signal bit line SBL is greater than the current passing through the reference bit line RBL. If the current passing through the signal bit line SBL is greater than the current passing through the reference bit line RBL, the memory cell (0, 0) is ON to provide data "1," and if the current passing through the signal bit line SBL is not greater than the current passing through the reference bit line RBL, the memory cell (0, 0) is OFF to provide data "0."

(II) Reading data from memory cell (1, 1)

To select the memory cell (1, 1), the word line WL1 and bit line BL1 are selected. The bit line BL0 paired with the bit line BL1 is selected to serve as a reference bit line, and the dummy cell (0, 0) connected to the bit line BL0 is selected to serve as a reference cell.

Address data is supplied to the row decoder 2 to select the word line WL1. The address data is also supplied to the current distributor 16 whose column decoder function sets the reference word line RWL to high and the word line WL to low as shown in FIG. 5. This turns on the transistors N5, N8, N10, and N11 and off the transistors N6, N7, N9, and N12.

A current I passing through the signal bit line SBL is made of the current $I_{N3}$ flowing to the bit line BL1 through the transistors N10 and N3 and the current $I_{N4}$ flowing to the bit line BL1 through the transistors N11 and N4.

A current of "½ of I" passing through the reference bit line RBL is the current $I_{N2}$ flowing to the bit line BL0 through the transistors N8 and N2.

A current of "½ of I" passing through the switching transistor N13 of the drain circuit 17 is the current $I_{N1}$ flowing to the bit line BL0 through the transistors N5 and N1.

As a result, the bit line BL1 is selected as a data read line and the bit line BL0 as a reference line. Namely, the dummy cell (0, 0) becomes ON due to the selection of the dummy word line DWL0, to pass the current I through the bit line BL0 and half the current I through the reference bit line RBL. If the selected memory cell (1, 1) is ON, the current I flows from the bit line SBL to the bit line BL1, and if the selected memory cell (1, 1) is OFF, the bit lines SBL and BL1 pass no current. The sense amplifier SA operates in the same manner as the case (I). (III) Reading data from memory cell connected to bit line other than bit lines BL0 and BL1.

This case is carried out based on the cases (I) and (II). In addition, a measure not to read unnecessary data must be taken. Namely, the reference word line RWL and word line WL are set to low as shown in FIG. 5. This turns off the transistors N5 to N12, to pass no current to the cell arrays 11 and 12.

In this way, the semiconductor memory of the embodiment having memory and dummy cells of an identical structure is capable of switching bit lines for a sense amplifier. This semiconductor memory provides the following effects:

(1) The semiconductor memory may employ a conventional memory cell array structure and there is no need of arranging special bit lines for dummy cells formed in the memory cell array.

(2) By inserting a proper number of dummy cells in the memory cell array, a dummy cell nearest to a selected memory cell can be selected, to minimize the difference between a memory cell current and a dummy cell current.

(3) Only one sense amplifier is needed to each pair of bit lines, to reduce a layout area and increase the operation speed of sense amplifiers.

The mask ROM according to the embodiment has the switching circuit SW that is controlled by the word line WL, reference word line RWL, and reference voltage line R and is arranged between the cell arrays and the sense amplifier SA. The sense amplifier SA is connected in parallel with the NMOS transistor N13 of the drain circuit 17. The switching circuit SW and transistor N13 pass each a half of a dummy cell current to a dummy cell, so that the dummy cell may pass, in total, the same current as an ON memory cell current.

When the memory cell connected to the bit line BL0 is accessed, the bit line BL1 is connected to a dummy cell. The switching circuit SW turns off the transistors N5, N8, N10, and N11 connected to the reference word line RWL and turns on the transistors N6, N7, N9, and N12 connected to the word line WL. As a result, the signal bit line SBL of the sense amplifier SA passes a current I.

On the reference bit line RBL side, the transistor N3 controls a voltage so that the reference bit line RBL may pass a current of "½ of I" through the ON transistor N9. At the same time, the transistor N13 passes a current of "½ of I" of to the ON transistor N12 so that a current half a dummy cell current I may flow to the dummy cell. The current of "½ of I" from the transistor N9 and the current of "½ of I" from the transistor N12 are combined to pass the current I to the bit line BL1 connected to the dummy cell, like the bit line BL0 connected to the ON memory cell.

In this way, the embodiment passes the same current to a memory cell and a dummy cell, and on the load side, bypasses a half of the dummy cell current to a route that is separate from the sense amplifier, to thereby improve the accuracy of current control.

This separate route is capable of switching bit lines from one to another, and therefore, is advantageous when applied to memory cells arranged in an array.

With this configuration, the semiconductor memory of the embodiment can employ an identical circuitry for the dummy cells and memory cells, to improve a sense margin of each OFF cell and increase operation speed. The dummy cells of the embodiment need no dedicated circuits, to reduce a layout area. According to the embodiment, the dummy cells and memory cells may have the same design, to simplify the semiconductor memory as a whole.

Figure 6A:
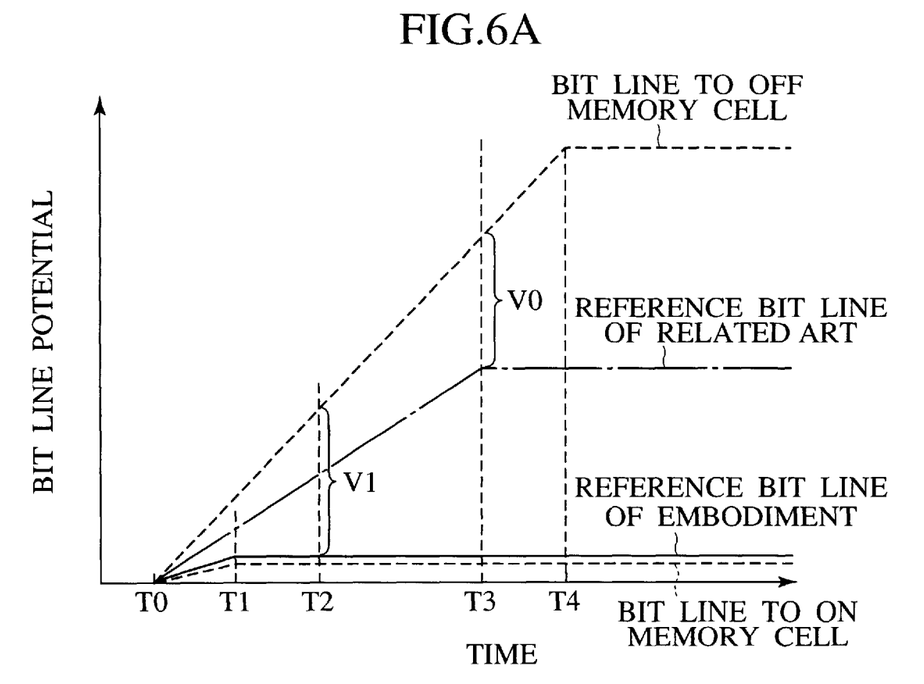
FIGS. 6A and 6B are graphs showing changes in the potential and current of bit lines in a read operation of the semiconductor memory of FIG. 2 in comparison with a related art.
Figure 6B:
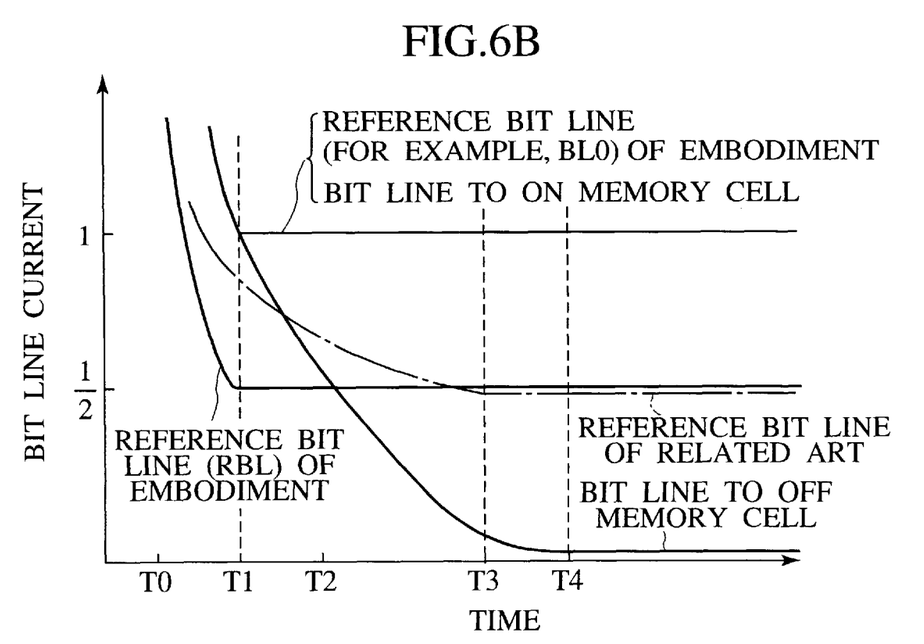

FIGS. 6A and 6B are graphs showing changes in the potential levels and currents of bit lines in a read operation of the semiconductor memory of the embodiment in comparison with the related art. In FIG. 6A, the potential level of a reference bit line according to the related art slowly increases up to an intermediate potential level between ON and OFF levels of a signal bit line because the reference bit line of the related art passes only half a current passing through the signal bit line. As a result, the related art needs a time between T0 and T3 to stabilize the potential. According to the embodiment, a dummy cell passes the same current as that passed through a memory cell. As a result, the embodiment can decrease an operation point of a bit line accessing a dummy cell to an operation point to access an ON memory cell and increase a voltage rising speed. The embodiment realizes a sufficient potential difference V1 between a bit line connected to an OFF memory cell and the reference bit line at T2 that is far earlier than T3 of the related art. The potential difference V1 to start data sensing of the embodiment at T2 is greater than the potential difference V0 to start data sensing of the related art at T3. Namely, the embodiment can cut a period of T2 to T3 to improve an access speed. By shortening a time to pass a current necessary to sense data, the embodiment reduces power consumption. In FIG. 6B, a time to stabilize a current passing through the reference bit line to "½ of I" of the embodiment is shorter than that of the related art. As a result, the embodiment can start comparing the reference bit line current with a current passing through a bit line connected to an ON memory cell earlier than the related art.

As mentioned above, the semiconductor memory according to the embodiment passes the same current I through a memory cell bit line and a dummy cell bit line when a memory cell to access is not OFF. Accordingly, the dummy cells and memory cells of the embodiment may have an identical circuit structure, to improve the accuracy of cell current, improve a sense margin of an OFF cell, and increase operation speed. The semiconductor memory of the embodiment needs a short time to pass a current to sense data, to thereby reduce power consumption.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor memory comprising:
   a memory cell array including memory cells;
   a dummy cell array including dummy cells;
   a first bit line configured to pass a current representing data stored in a memory cell selected from the memory cell array or a current representing data stored in a dummy cell selected from the dummy cell array;
   a second bit line configured to pass the current representing the data stored in the selected dummy cell if the first bit line passes the current representing the data stored in the selected memory cell or the current representing the data stored in the selected memory cell if the first bit line passes the current representing the data stored in the selected dummy cell;
   a switching circuit configured to receive the currents passing through the first and second bit lines and provide an output current substantially half the current representing the data stored in the selected dummy cell and an output current equal to the current representing the data stored in the selected memory cell; and
   a sense amplifier configured to receive the output current substantially half the current representing the data stored in the selected dummy cell and the output current equal to the current representing the data stored in the selected memory cell and amplify those output currents.

2. The semiconductor memory as claimed in claim 1, wherein the switching circuit comprises:
   a first current divider configured to receive the current passing through the first bit line and divide the received current into two partial currents;
   a second current divider configured to receive the current passing through the second bit line and divide the received current into two partial currents; and
   a distributor configured to receive the partial currents from the first and second current dividers and provide an output formed by adding up two of the partial currents and an output formed by selecting one of the partial currents.

3. The semiconductor memory as claimed in claim 2, further comprising:
   a reference voltage line configured to provide a reference voltage to the first and second current dividers.

4. The semiconductor memory as claimed in claim 3, wherein the first and second current dividers control, according to the reference voltage from the reference voltage line, the timing of the partial currents supplied to the distributor.

5. The semiconductor memory as claimed in claim 3, wherein the first and second current dividers control the sizes of the partial currents according to the reference voltage from the reference voltage line.

6. The semiconductor memory as claimed in claim 3, wherein the first current divider includes:
   a first NMOS transistor having a source electrode electrically coupled to the first bit line, a gate electrode electrically coupled to the reference voltage line, and a drain electrode electrically coupled to the distributor; and
   a second NMOS transistor having a source electrode electrically coupled to the first bit line,
   a gate electrode electrically coupled to the reference voltage line, and a drain electrode electrically coupled to the distributor.

7. The semiconductor memory as claimed in claim 6, wherein the first and second NMOS transistors have the same driving capacity and the same structure.

8. The semiconductor memory as claimed in claim 3, wherein the second current divider includes:
   a first NMOS transistor having a source electrode electrically coupled to the second bit line, a gate electrode electrically coupled to the reference voltage line, and a drain electrode electrically coupled to the distributor; and
   a second NMOS transistor having a source electrode electrically coupled to the second bit line, a gate electrode electrically coupled to the reference voltage line, and a drain electrode electrically coupled to the distributor.

9. The semiconductor memory as claimed in claim 1, wherein the dummy cells are arranged in the memory cell array.

10. The semiconductor memory as claimed in claim 2, wherein:
    the distributor provides an output formed by recombining the partial currents from the first current divider if the first bit line passes the current representing the data stored in the selected memory cell and an output formed by recombining the partial currents from the second current divider if the second bit line passes the current representing the data stored in the selected-.memory cell.

11. The semiconductor memory as claimed in claim 2, wherein:
    the distributor provides an output formed by selecting one of the partial currents from the first current divider if the first bit line passes the current representing the data stored in the selected dummy cell and an output formed by selecting one of the partial currents from the second current divider if the second bit line passes the current representing the data stored in the selected dummy cell.

12. The semiconductor memory as claimed in claim 1, wherein the switching circuit comprises:

a reference word line configured to provide a first potential level if the first bit line passes the current representing the data stored in the selected memory cell or a second potential level if the first bit line passes the current representing the data stored in the selected dummy cell; and a word line configured to provide the second potential level if the first bit line passes the current representing the data stored in the selected memory cell or the first potential level if the first bit line passes the current representing the data stored in the selected dummy cell.

13. The semiconductor memory as claimed in claim 12, wherein the switching circuit further comprises:

a first NMOS transistor having a gate electrode electrically coupled to the reference word line and a source electrode electrically coupled to the first current divider;

a second NMOS transistor having a gate electrode electrically coupled to the word line and a source electrode electrically coupled to the first current divider;

a third NMOS transistor having a gate electrode electrically coupled to the word line, a source electrode electrically coupled to the first current divider, and a drain electrode electrically coupled to a drain electrode of the second NMOS transistor;

a fourth NMOS transistor having a gate electrode electrically coupled to the reference word line and a source electrode electrically coupled to the first current divider;

a fifth NMOS transistor having a gate electrode electrically coupled to the word line, a source electrode electrically coupled to the second current divider, and a drain electrode electrically coupled to a drain electrode of the fourth NMOS transistor;

a sixth NMOS transistor having a gate electrode electrically coupled to the reference word line, a source electrode electrically coupled to the second current divider, and a drain electrode electrically coupled to the drain electrode of the second NMOS transistor;

a seventh NMOS transistor having a gate electrode electrically coupled to the reference word line, a source electrode electrically coupled to the second current divider, and a drain electrode electrically coupled to the drain electrode of the second NMOS transistor; and an eighth NMOS transistor having a gate electrode electrically coupled to the word line, a source electrode electrically coupled to the second current divider, and a drain electrode electrically coupled to a drain electrode of the first NMOS transistor.

14. The semiconductor memory as claimed in claim 13, wherein the switching circuit further comprises:

a drain circuit electrically coupled to the drain electrode of the first NMOS transistor.

15. The semiconductor memory as claimed in claim 14, wherein the drain circuit comprises:

an NMOS transistor having a source electrode electrically coupled to a power source and a drain electrode electrically coupled to the drain electrode of a PMOS transistor.

16. A method of sensing data stored in a memory cell in a memory cell array with paired first and second bit lines, comprising:

dividing a current passing through the first bit line into two partial currents;

dividing a current passing through the second bit line into two partial currents;

if the current passing through the first bit line represents the data stored in the memory cell and if the current passing through the second bit line represents data stored in a dummy cell in a dummy cell array, providing a first output formed by recombining the partial currents from the first bit line, providing a second output formed by selecting one of the partial currents from the second bit line, and amplifying the first and second outputs; and if the current passing through the first bit line represents the data stored in the dummy cell and if the current passing through the second bit line represents the data stored in the memory cell, providing a third output formed by selecting one of the partial currents from the first bit line, providing a fourth output formed by recombining the partial currents from the second bit line, and amplifying the third and fourth outputs.

17. The method as claimed in claim 16, further comprising:

determining, according to an input address signal, whether or not the first bit line passes the current representing the data stored in the memory cell.

* * * * *